United States Patent
Redaelli et al.

(10) Patent No.: US 8,723,155 B2
(45) Date of Patent: May 13, 2014

(54) MEMORY CELLS AND INTEGRATED DEVICES

(75) Inventors: Andrea Redaelli, Castenovo (IT); Ugo Russo, Monza (IT); Agostino Pirovano, Milan (IT); Simone Lavizzari, Nova Milanese (IT)

(73) Assignee: Micron Technology, Inc., Boise, ID (US)

( * ) Notice: Subject to any disclaimer, the term of this patent is extended or adjusted under 35 U.S.C. 154(b) by 321 days.

(21) Appl. No.: 13/298,722

(22) Filed: Nov. 17, 2011

(65) Prior Publication Data

US 2013/0126812 A1 May 23, 2013

(51) Int. Cl.
*G11C 11/21* (2006.01)
*H01L 49/00* (2006.01)

(52) U.S. Cl.
USPC ............................... 257/4; 365/148; 365/163

(58) Field of Classification Search
USPC ..................................... 257/4; 365/148, 163
See application file for complete search history.

(56) References Cited

U.S. PATENT DOCUMENTS

| 7,453,111 | B2* | 11/2008 | Ryoo et al. ............... 257/295 |
| 7,619,933 | B2 | 11/2009 | Sarin |
| 7,773,413 | B2 | 8/2010 | Shalvi |
| 7,800,092 | B2 | 9/2010 | Liu et al. |
| 2005/0006681 | A1 | 1/2005 | Okuno |
| 2006/0076548 | A1* | 4/2006 | Park et al. ............... 257/2 |
| 2006/0113520 | A1* | 6/2006 | Yamamoto et al. ........ 257/3 |
| 2007/0075347 | A1 | 4/2007 | Lai et al. |
| 2007/0108431 | A1* | 5/2007 | Chen et al. ............... 257/4 |
| 2008/0128677 | A1* | 6/2008 | Park et al. ............... 257/4 |
| 2008/0137400 | A1* | 6/2008 | Chen et al. ............... 365/163 |
| 2009/0039333 | A1 | 2/2009 | Chang et al. |
| 2009/0108247 | A1 | 4/2009 | Takaura et al. |
| 2009/0302300 | A1 | 12/2009 | Chang |
| 2011/0031461 | A1 | 2/2011 | Kang et al. |

FOREIGN PATENT DOCUMENTS

| WO | PCT/US2012/063962 | 3/2013 |
| WO | WO 2013/039496 | 3/2013 |

OTHER PUBLICATIONS

Bez, "Chalcogenide PCM: a Memory Technology for Next Decade", IEEE, 2009, pp. 5.1.1-5.1.4.
Czubatyj et al., "Current Reduction in Ovonic Memory Devices", Downloaded from www.epcos.org/library/papers/pdf_2006/pdf . . . /Czubatyj.pdf prior to Nov. 17, 2011.

(Continued)

*Primary Examiner* — Evan Pert
(74) *Attorney, Agent, or Firm* — Wells St. John P.S.

(57) ABSTRACT

Some embodiments include integrated devices, such as memory cells. The devices may include chalcogenide material, an electrically conductive material over the chalcogenide material, and a thermal sink between the electrically conductive material and the chalcogenide material. The thermal sink may be of a composition that includes an element in common with the electrically conductive material and includes an element in common with the chalcogenide material. Some embodiments include a method of forming a memory cell. Chalcogenide material may be formed over heater material. Electrically conductive material may be formed over the chalcogenide material. A thermal sink may be formed between the electrically conductive material and the chalcogenide material. The thermal sink may be of a composition that includes an element in common with the electrically conductive material and includes an element in common with the chalcogenide material.

12 Claims, 4 Drawing Sheets

(56) References Cited

OTHER PUBLICATIONS

Fazio, "Future Directions of Non-Volatile Memory in Compute Applications", IEEE, 2009, pp. 27.7.1-27.7.4.

Lee et al., "Programming Disturbance and Cell Scaling in Phase Change Memory: For up to 16nm based 4F2 Cell", IEEE, 2010 Symposium on VLSI Technology Digest of Technical Papers, pp. 199-200.

Russo et al., "Modeling of Programming and Read Performance in Phase-Change Memories—Part II: Program Disturb and Mixed-Scaling Approach". IEEE Transactions on Electron Devices, vol. 55(2), Feb. 2008, pp. 515-522.

\* cited by examiner

MEMORY CELLS AND INTEGRATED DEVICES

TECHNICAL FIELD

Memory cells, integrated devices, and methods of forming memory cells.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

One type of memory is phase change memory (PCM). Such memory utilizes phase change material as a programmable material. Example phase change materials that may be utilized in PCM are chalcogenide materials.

The phase change materials reversibly transform from one phase to another through application of appropriate electrical stimulus. Each phase may be utilized as a memory state, and thus an individual PCM cell may have two selectable memory states that correspond to two inducible phases of the phase change material.

A problem that may occur during programming of the memory cells of a PCM array is that there may be thermal transfer between adjacent memory cells (so-called "thermal disturb"). Accordingly, the memory state of a memory cell may be disturbed when an adjacent memory cell is programmed, which can lead to unreliability of data storage within a memory array. The problem can increase with increasing downsizing of integration.

It would be desirable to develop PCM cell architectures which alleviate or prevent the above-discussed problem, and to develop methods of forming such PCM cell architectures.

DETAILED DESCRIPTION OF THE ILLUSTRATED EMBODIMENTS

Programming of a PCM cell may comprise heating of a chalcogenide material within the memory cell to cause a phase change within the chalcogenide material. Only a fraction of the total volume of the chalcogenide material within the cell may be heated. Some embodiments include recognition that thermal disturbance between adjacent memory cells may be reduced by controlling the size of the heated fraction of chalcogenide material within a memory cell during programming of the memory cell.

A PCM cell may comprise chalcogenide material between a heater and a top electrode. The chalcogenide material may be heated with the heater to cause the desired phase change within the chalcogenide material during programming. The size of the heated fraction of the chalcogenide material may be influenced by the overall thermal resistance along the chalcogenide material to the top electrode, including difference thermal resistance contributions. The difference thermal resistance contributions may include: chalcogenide material thermal resistance, top electrode thermal resistance, and interface thermal resistance between the two materials.

Some embodiments include provision of an interlayer to reduce (and in some cases, minimize) interface thermal resistance. Such interlayer may be referred to as a "thermal sink material." The thermal sink material is between chalcogenide material and a top electrode, and alters thermal resistance along an upper region of the chalcogenide material relative to a conventional PCM cell. The utilization of such thermal sink material may alleviate or prevent thermal disturb between adjacent PCM cells during programming of a memory array.

Example embodiments are described with reference to FIGS. 1-10.

Figure 1:
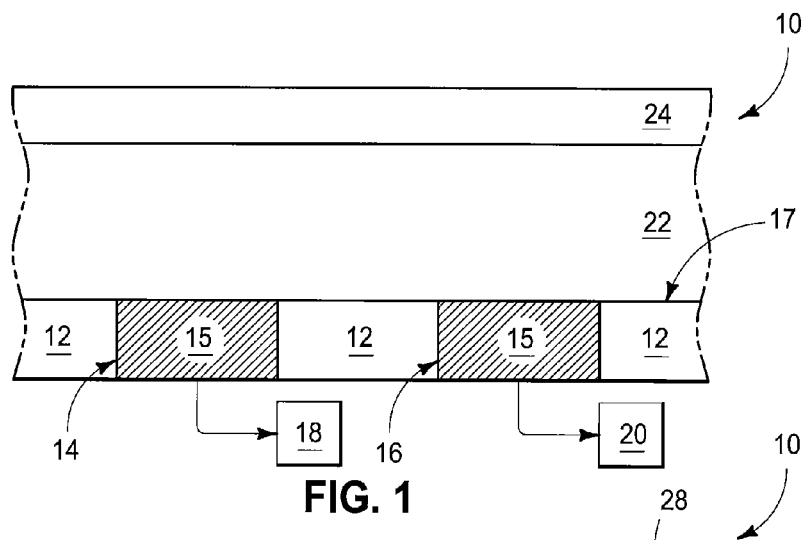
FIGS. 1-5 are diagrammatic cross-sectional views of a construction at various process stages of an example embodiment method of forming memory cells.

Referring to FIG. 1, a construction 10 comprises a pair of electrically conductive interconnects 14 and 16 extending through a dielectric material 12.

The dielectric material 12 may comprise any suitable composition or combination of compositions; and in some embodiments may comprise, consist essentially of, or consist of one or more of silicon dioxide, silicon nitride, and any of various doped silicate glasses (for instance, borophosphosilicate glass, phosphosilicate glass, fluorosilicate glass, etc.).

The interconnects 14 and 16 comprise electrically conductive material 15. Such electrically conductive material may comprise any suitable composition or combination of compositions; and in some embodiments may comprise, consist essentially of, or consist of tungsten.

The dielectric material 12, and interconnects 14 and 16, may be supported by a semiconductor base (not shown). Such base may comprise monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

The interconnects 14 and 16 be representative of a large number of interconnects formed across a semiconductor base. Ultimately, each interconnect is connected to a memory cell of a memory array (with example memory cells being shown in FIG. 5). The interconnects 14 and 16 are diagrammatically illustrated to be electrically connected to circuitry 18 and 20, respectively. Such circuitry may include control circuitry utilized for providing electrical input to individual memory cells during programming operations and during reading operations. The circuitry may also include access/sense lines (e.g., wordlines and bitlines) which electrically couple the memory cells to the control circuitry. In some embodiments, the illustrated interconnects 14 and 16 may be coupled to a common access/sense line, and in other embodiments the interconnects may be coupled to separate access/sense lines.

A planarized surface 17 extends across materials 12 and 15. Such planarized surface may be formed with any suitable processing, including, for example, chemical-mechanical polishing (CMP).

Heater material 22 is formed across the interconnects 14 and 16. The heater material is ultimately patterned into heater components of PCM cells (as described below with reference to FIG. 3), and may comprise any suitable composition or combination of compositions. In some embodiments, the heater material may comprise, consist essentially of, or consist of titanium and nitrogen. Such heater material may comprise TiN in some embodiments, where the chemical formula shows the components of the composition and is not utilized to indicate a specific stoichiometry. The heater material may be, for example, a TiN composite, doped TiN, etc. The heater material may be formed with any suitable processing, including, for example, one or more of atomic layer deposition (ALD), chemical vapor deposition (CVD) and physical vapor deposition (PVD).

Chalcogenide material 24 is formed over the heater material. The chalcogenide material may comprise any suitable composition. An example chalcogenide material comprises, consists essentially of, or consists of germanium, antimony and tellurium, and may be referred to as GST. In some embodiments, the chalcogenide material may correspond to $Ge_2Sb_2Te_5$. The chalcogenide material may be formed utilizing any suitable processing, including, for example, one or more of ALD, CVD and PVD. The chalcogenide material may be utilized as memory material in PCM cells in some embodiments (with example PCM cells being shown in FIG. 5).

Figure 2:
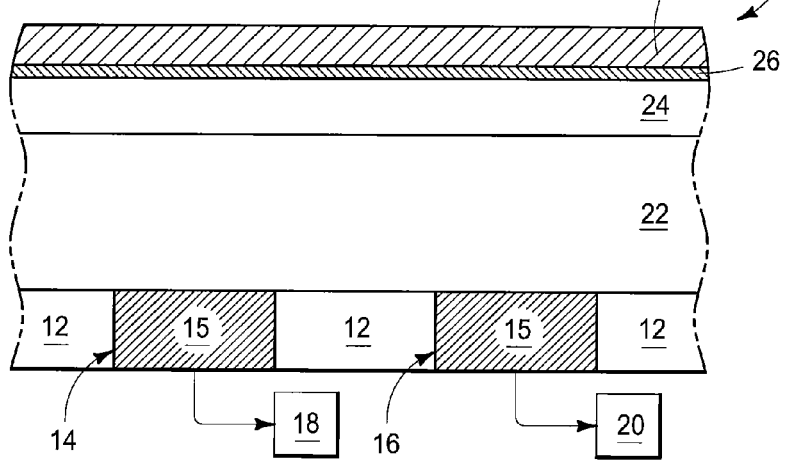

Referring to FIG. 2, thermal sink material 26 is formed over the chalcogenide material, and an electrically conductive capping material 28 is formed over the thermal sink material. In some embodiments, the material 28 may be referred to as a top electrode material.

In some embodiments, the thermal sink material 26 comprises a composition containing at least one element in common with the chalcogenide material 24 and at least one element in common with the capping material 28.

In some example embodiments, the material 28 comprises, consists essentially of, or consists of titanium (for instance, comprises elemental titanium or titanium nitride); the chalcogenide material comprises, consists essentially of, or consists of GST; and the thermal sink material comprises, consists essentially of, or consists of titanium in combination with one or both of tellurium and antimony.

As another example, in some embodiments the material 28 comprises, consists essentially of, or consists of a combination of titanium, aluminum and nitrogen (for instance, may be described by the chemical formula TiAlN, where such formula shows the components of the composition and is not utilized to indicate a specific stoichiometry); the chalcogenide material comprises, consists essentially of, or consists of GST; and the thermal sink material comprises, consists essentially of, or consists of one or both of titanium and aluminum in combination with one or both of tellurium and antimony.

As another example, in some embodiments the material 28 comprises, consists essentially of, or consists of tantalum (for instance, comprises elemental tantalum or tantalum nitride); the chalcogenide material comprises, consists essentially of, or consists of GST; and the thermal sink material comprises, consists essentially of, or consists of tantalum in combination with one or both of tellurium and antimony.

As another example, in some embodiments the material 28 comprises, consists essentially of, or consists of tungsten (for instance, comprises elemental tungsten or tungsten nitride); the chalcogenide material comprises, consists essentially of, or consists of GST; and the thermal sink material comprises, consists essentially of, or consists of tungsten in combination with one or both of tellurium and antimony.

The thermal sink material 26 may be formed with any suitable processing, and in some embodiments may be deposited utilizing one or more of ALD, CVD and PVD. In the embodiment of FIG. 2, the thermal sink material is deposited directly onto the chalcogenide material 24.

The thermal sink material may improve thermal dissipation within a memory cell to alleviate or prevent the thermal disturb problem discussed above in the "background" section of this disclosure.

The thermal sink material may be formed to any suitable thickness. In some embodiments, the thermal sink material may be kept very thin so that it does not substantially alter programming characteristics of an individual memory cell relative to an analogous memory cell lacking the thermal sink material. For instance, the thermal sink material may be formed to a thickness of less than or equal to about 5 nanometers; and in some embodiments may be formed to a thickness of from about 1 nanometer to about 5 nanometers. Such thin regions of thermal sink material may be sufficient to alleviate or prevent the thermal disturb problem, while having little impact on the programming characteristics of an individual memory cell.

The electrically conductive capping material 28 may be formed with any suitable processing, and in some embodiments may be deposited utilizing one or more of ALD, CVD and PVD. In the embodiment of FIG. 2, the electrically conductive capping material 28 is formed directly on an upper surface of the thermal sink material 26.

Figure 3:
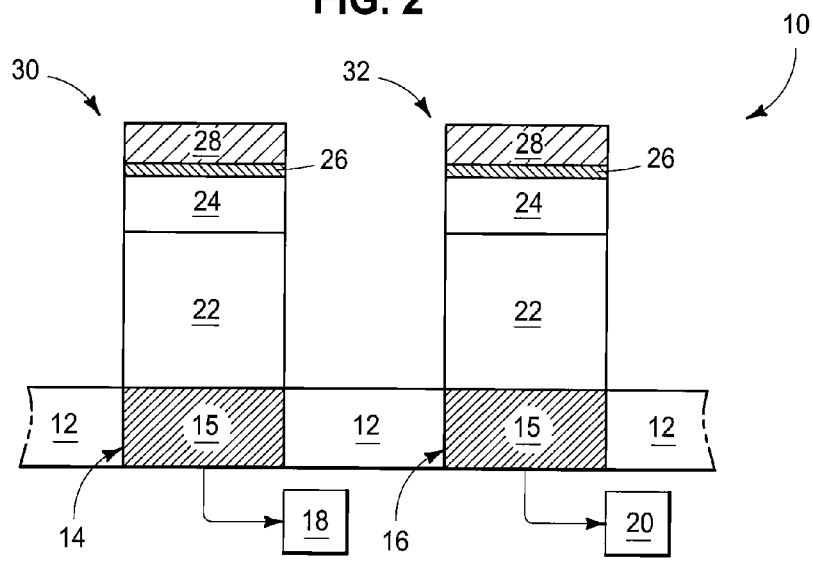

Referring to FIG. 3, the materials 22, 24, 26 and 28 are patterned into memory cells 30 and 32. The memory cell 30 is directly over and electrically coupled with interconnect 14; and the memory cell 32 is directly over and electrically coupled with interconnect 16. Materials 22, 24, 26 and 28 may be patterned with any suitable processing. For instance, a patterned mask (not shown) may be formed over material 28; a pattern from such mask may be transferred into the underlying materials 22, 24, 26 and 28 with one or more suitable etches; and then the mask may be removed to leave the construction shown in FIG. 3. The patterned mask may comprise any suitable composition, such as, for example, photolithographically-patterned photoresist and/or one or more materials patterned utilizing pitch-multiplication methodologies. The material 28 may be considered to correspond to top electrodes of the memory cells in some embodiments.

Figure 4:
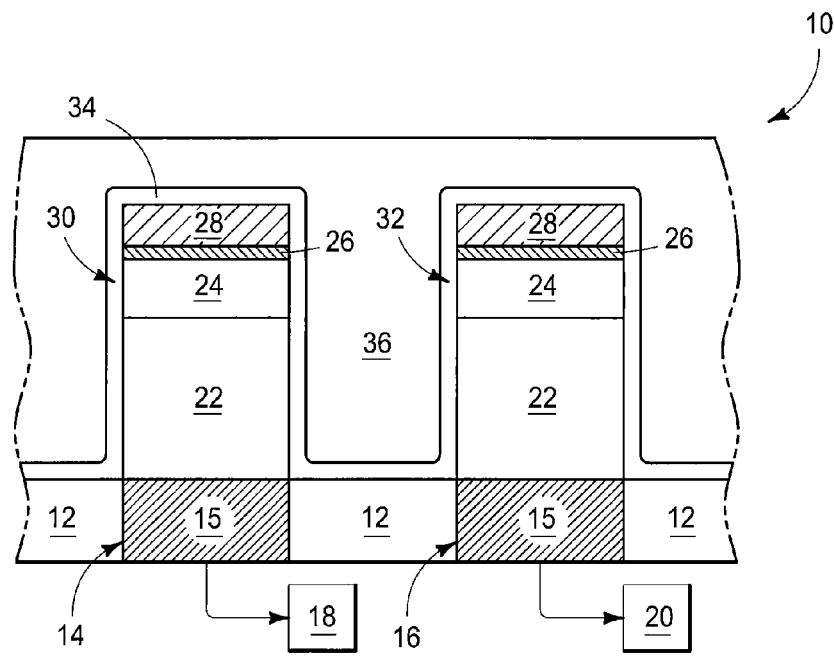

Referring to FIG. 4, an electrically insulative liner 34 is formed along and between the memory cells 30 and 32, and a dielectric material 36 is formed over the electrically insulative liner. The liner may comprise any suitable composition or combination of compositions, and in some embodiments may comprise, consist essentially of, or consist of silicon nitride. The dielectric material 36 may comprise any suitable composition or combination of compositions, and in some embodiments may comprise, consist essentially of, or consist of silicon dioxide and/or any of various doped silicate glasses.

Figure 5:
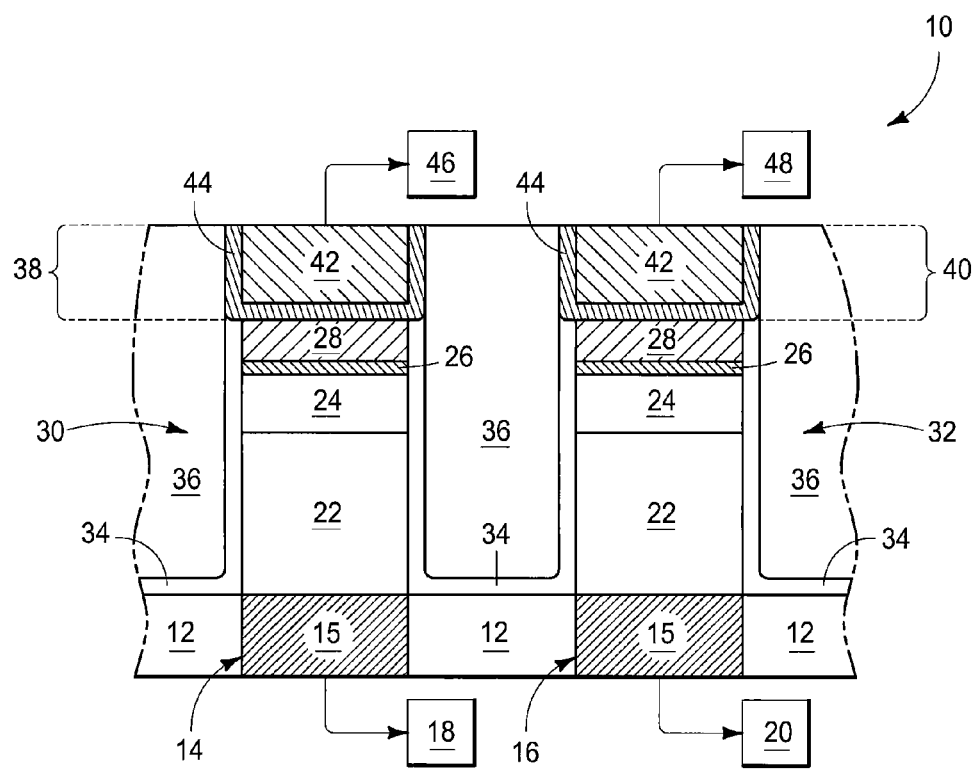

Referring to FIG. 5, electrically conductive structures 38 and 40 are formed over memory cells 30 and 32, respectively. The electrically conductive structures may be lines that extend in and out of the page relative to the cross-sectional view of FIG. 5. In the shown embodiment, each of the electrically conductive structures comprises a conductive core material 42 and a barrier material 44 along an outer periphery of the core material. In some embodiments, the core material may comprise, consist essentially of, or consist of copper; and the barrier material may be a barrier to copper migration. In such embodiments, the barrier material may comprise any suitable composition, and may, for example, comprise a ruthenium-containing material. In some embodiments, other conductive materials besides the shown materials 42 and 44 may be utilized in conductive structures 38 and 40. If the conductive core material 42 does not comprise components which migrate, the barrier material 44 may be omitted.

The structures 38 and 40 are shown connected to circuitry 46 and 48, respectively. In some embodiments, structures 38 and 44 may correspond to access/sense lines, and the circuitry 46 and 48 may be utilized to control electrical flow through such access/sense lines. The memory cells 30 and 32 may be representative of a large number of cells of a PCM array, and each memory cell of such array may be uniquely addressed through the combination of an access/sense line connected to the illustrated bottoms of the cells through conductive material 15, and an access/sense line connected to the illustrated tops of the cells through electrically conductive capping material 28.

The thermal sink material 26 can reduce heating within the memory cells during programming relative to heating which may otherwise occur in the absence of such thermal sink material, and thus can alleviate or prevent thermal disturb between the adjacent memory cells 30 and 32 relative to the thermal disturb that may otherwise occur in the absence of the thermal sink material. The same applies for cells in the perpendicular directions in the array (for instance, memory cells connected to the same bitline in some embodiments). Accordingly, the incorporation of the thermal sink material 26 into memory cells 30 and 32 may beneficially alleviate or prevent the thermal disturb problem that may be associated with some conventional PCM arrays.

The utilization of thermal sink material 26 having components in common with both the chalcogenide material 24 and the electrically conductive capping material 28 alleviates thermal mismatch that may otherwise occur. Specifically, one surface of the thermal sink material is directly against the chalcogenide material, and another surface of the thermal sink material is directly against the electrically conductive capping material. The formulation of the thermal sink material to have a component in common with the chalcogenide material may alleviate or prevent thermal mismatch that may otherwise occur between the thermal sink material and the chalcogenide material (with "thermal mismatch" including, for example, substantially different coefficients of thermal expansion that may lead to peeling or separation between the adjacent materials during changes in temperature). Similarly, the formulation of the thermal sink material to have a component in common with the electrically conductive capping material may alleviate or prevent thermal mismatch that may otherwise occur between the thermal sink material and such electrically conductive capping material.

The utilization of thermal sink material 26 having components in common with both the chalcogenide material 24 and the electrically conductive capping material 28 may improve adhesion between the chalcogenide material and the capping material in some embodiments, and specifically may improve adhesion as compared to structures lacking such thermal sink material.

The various materials of the memory cells 30 and 32 shown in FIG. 5 may comprise any suitable thicknesses. For instance, material 22 may be formed to a thickness of at least about 30 nanometers, material 24 may be formed to a thickness within a range of from about 30 nanometers to about 50 nanometers, material 26 may be formed to a thickness within a range of from about 1 nanometer to about 5 nanometers, and material 28 may be formed to a thickness within a range of from about 20 nanometers to about 50 nanometers.

The embodiment of FIGS. 1-5 forms thermal sinks within PCM cells by depositing thermal sink material 26 directly onto chalcogenide material 24. Such is one of many methods for forming thermal sinks within PCM cells. Another example embodiment method is described with reference to FIGS. 6-8.

Figure 6:
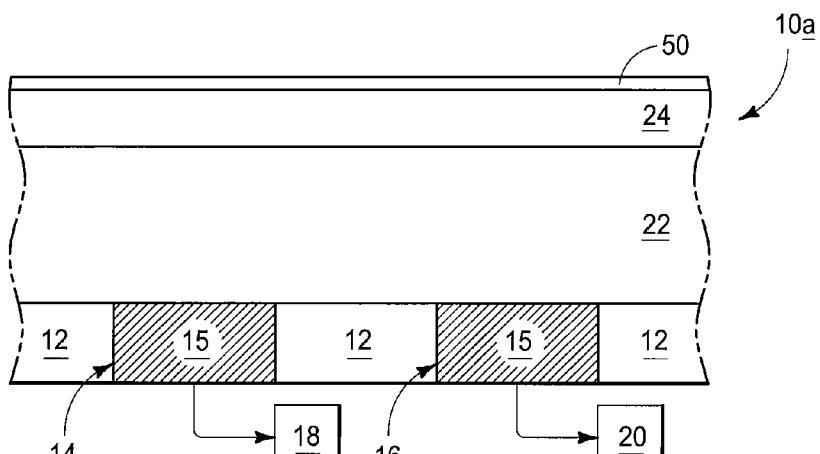
FIGS. 6-8 are diagrammatic cross-sectional views of a construction at various process stages of another example embodiment method of forming memory cells. The process stage of FIG. 6 may follow that of FIG. 1.

Referring to FIG. 6, a construction 10a is shown at a processing stage subsequent to that of FIG. 1. The construction comprises a precursor material 50 formed directly on an upper surface of chalcogenide material 24. The precursor material ultimately combines with a component from the chalcogenide material 24 and/or from the electrically conductive capping material 28 (shown in FIG. 7) to form a thermal sink comprising components in common with both the chalcogenide material and the electrically conductive capping material. In some embodiments, the precursor material 50 may comprise a component in common with the capping material, and may be configured to react with the chalcogenide material 24 to form a thermal sink. For instance, in some embodiments the precursor material may comprise one or more of titanium, tantalum, tungsten and aluminum. The precursor material may be configured for reaction with the chalcogenide material by incorporating a leaving group into the precursor. For instance, the precursor may comprise a metallo-organic, a metal halide, etc.

Figure 7:
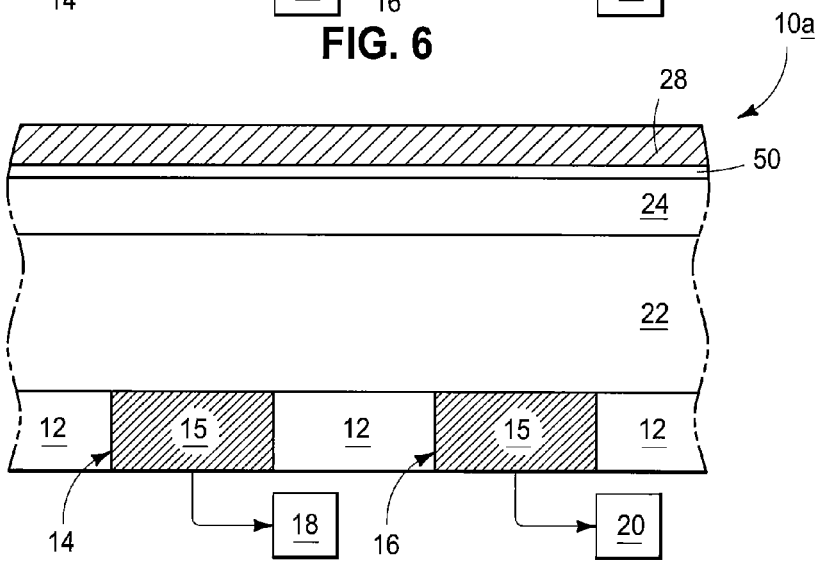

Referring to FIG. 7, the electrically conductive capping material 28 is formed directly on the precursor material 50.

Figure 8:
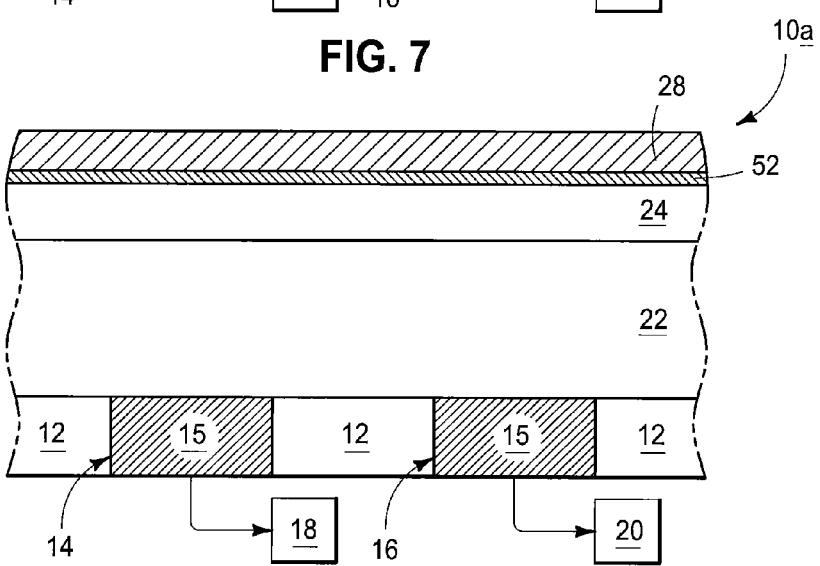

Referring to FIG. 8, construction 10a is subjected to thermal processing which converts precursor material 50 (FIG. 7) into a thermal sink material 52 comprising a component in common with chalcogenide material 24 and a component in common with electrically conductive capping material 28. The thermal processing may comprise, for example, heating of the precursor material 50 and the chalcogenide material 24 to a temperature of at least about 400° C. to induce reaction of the precursor material with the chalcogenide material. For instance, in some embodiments the chalcogenide material may comprise GST, the precursor material may comprise titanium, and the thermal treatment may form titanium telluride. As another example, in some embodiments the chalcogenide material may comprise GST, the precursor material may comprise tungsten, and the thermal treatment may form tungsten telluride.

The above-described thermal treatment may be conducted before, during and/or after formation of the electrically conductive capping material 28 in various embodiments. For instance, the electrically conductive capping material may be deposited under conditions having a high enough temperature to achieve the thermal treatment of the precursor material and the chalcogenide material. Alternatively, the precursor material and the chalcogenide material may be heated to the thermal treatment temperature prior to deposition of the electrically conductive capping material. In other embodiments, the precursor material and the chalcogenide material may be heated to the thermal treatment temperature after deposition of the electrically conductive capping material.

The construction 10a of FIG. 8 may be subsequently subjected to processing analogous to that described above with reference to FIGS. 3-5 to form an array of memory cells from such construction.

Another example embodiment method for forming a thermal sink within PCM cells is described with reference to FIGS. 9 and 10.

Figure 9:
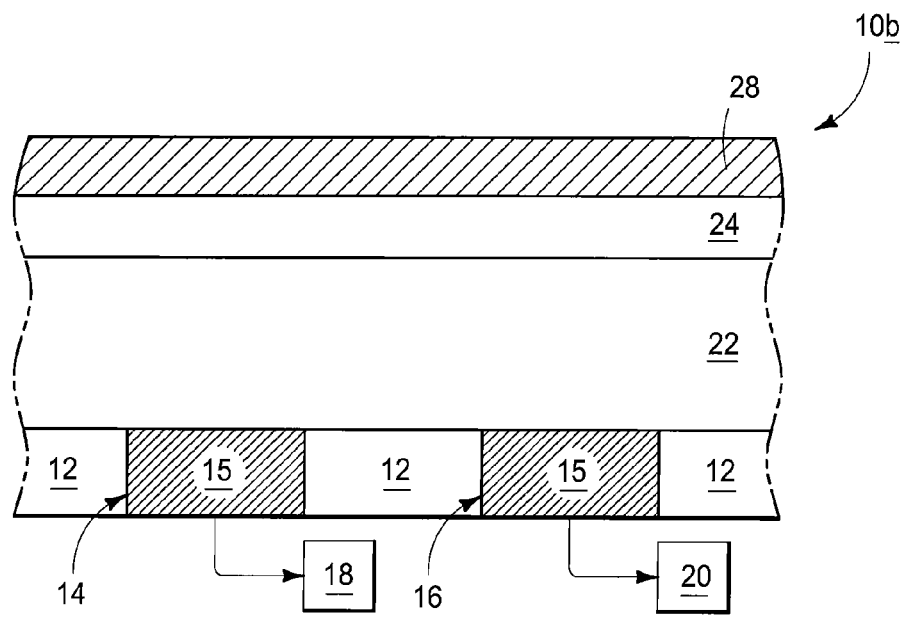
FIGS. 9 and 10 are diagrammatic cross-sectional views of a construction at various process stages of another example embodiment method of forming memory cells. The process stage of FIG. 9 may follow that of FIG. 1.

Referring to FIG. 9, a construction 10b is shown at a processing stage subsequent to that of FIG. 1. The construction comprises the electrically conductive capping material 28 formed directly on an upper surface of chalcogenide material 24.

Figure 10:
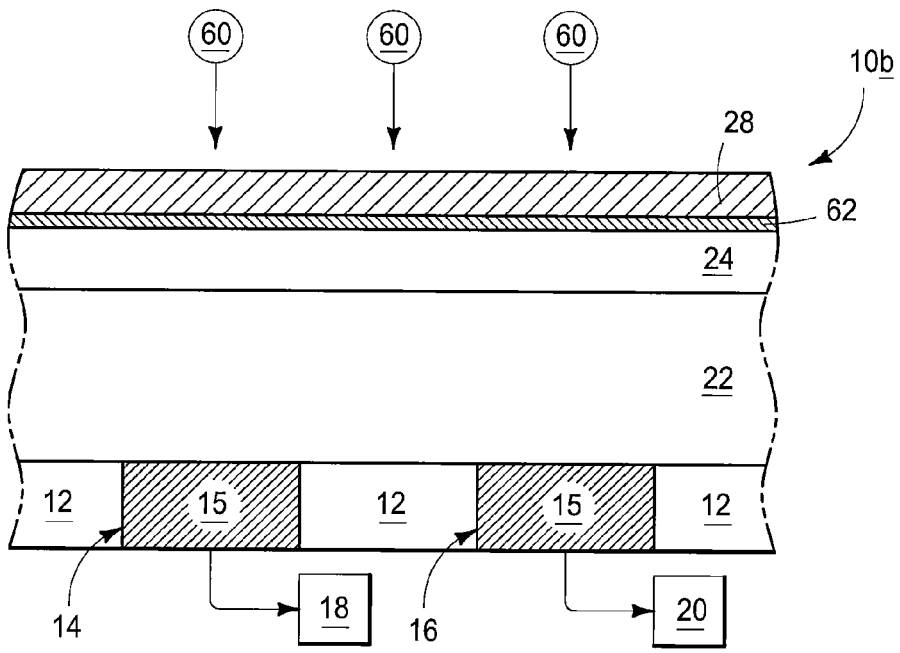

Referring to FIG. 10, one or more ions (i.e., dopants) are implanted through the electrically conductive capping material and to an interface of the capping material and the chalcogenide material. The ions cause intermixing across such interface to form a thermal sink 62 comprising one or more components of the chalcogenide material in combination with one or more components of the capping material. For instance, in some embodiments the electrically conductive capping material comprises titanium nitride; the chalcogenide material comprises GST; and the thermal sink comprises titanium telluride.

The construction 10b of FIG. 10 may be subsequently subjected to processing analogous to that described above with reference to FIGS. 3-5 to form an array of memory cells from such construction.

The embodiments described above show that the thermal sink material may be formed between an electrically conductive capping material and a chalcogenide material through any of numerous methods in various embodiments; and may be formed before, during, and/or after formation of the electrically conductive capping material.

The memory cells and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated device comprising a chalcogenide material, a top electrode over the chalcogenide material, and an interlayer between the top electrode and the chalcogenide material. The interlayer lowers thermal resistance in the device relative to the thermal resistance which would occur across a top electrode/chalcogenide material interface of the device in the absence of the interlayer.

Some embodiments include an integrated device comprising a chalcogenide material, an electrically conductive material over the chalcogenide material, and a thermal sink between the electrically conductive material and the chalcogenide material. The thermal sink is directly against the conductive material and the chalcogenide material. The thermal sink comprises a composition that includes an element in common with the electrically conductive material and includes an element in common with the chalcogenide material.

Some embodiments include a memory cell comprising a heater material, a chalcogenide material over the heater material, an electrically conductive material over the chalcogenide material, and a thermal sink between the electrically conductive material and the chalcogenide material. The thermal sink is directly against both the electrically conductive material and the chalcogenide material. The thermal sink comprises a composition that includes an element in common with the electrically conductive material and includes an element in common with the chalcogenide material.

Some embodiments include a method of forming a memory cell. Chalcogenide material is formed over heater material. An electrically conductive material is formed over the chalcogenide material. A thermal sink is formed between the electrically conductive material and the chalcogenide material. The thermal sink is directly against the conductive material and the chalcogenide material. The thermal sink comprises a composition that includes an element in common with the electrically conductive material and includes an element in common with the chalcogenide material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated device, comprising:
    chalcogenide material comprising antimony, tellurium and germanium;
    an electrically conductive material over the chalcogenide material; and
    a thermal sink between the electrically conductive material and the chalcogenide material, the thermal sink being directly against the conductive material and the chalcogenide material; the thermal sink comprising a composition that includes antimony and an element in common with the electrically conductive material.

2. The device of claim 1 wherein the conductive material comprises titanium, and wherein the thermal sink comprises titanium and the antimony.

3. The device of claim 1 wherein:
    the conductive material comprises titanium, aluminum and nitrogen; and
    the thermal sink comprises the antimony in combination with one or both of titanium and aluminum.

4. The device of claim 1 wherein:
    the conductive material comprises tantalum; and
    the thermal sink comprises tantalum in combination with the antimony.

5. The device of claim 1 wherein:
    the conductive material comprises tungsten; and
    the thermal sink comprises tungsten in combination with the antimony.

6. The device of claim 1 wherein the thermal sink has a thickness of less than or equal to about 5 nanometers.

7. The device of claim 1 wherein the thermal sink has a thickness within a range of from about 1 nanometer to about 5 nanometers.

8. A memory cell, comprising:
 a heater material;
 chalcogenide material over the heater material; wherein the chalcogenide material comprises antimony, tellurium and germanium;
 an electrically conductive material over the chalcogenide material; and
 a thermal sink between the electrically conductive material and the chalcogenide material, the thermal sink being directly against the conductive material and the chalcogenide material; the thermal sink comprising a composition that includes antimony and an element in common with the electrically conductive material.

9. The memory cell of claim 8 wherein the electrically conductive material comprises titanium, and wherein the thermal sink comprises titanium in combination with the antimony.

10. The memory cell of claim 8 wherein the electrically conductive material comprises tantalum, and wherein the thermal sink comprises tantalum in combination with the antimony.

11. The memory cell of claim 8 wherein the electrically conductive material comprises tungsten, and wherein the thermal sink comprises tungsten in combination with the antimony.

12. The memory cell of claim 8 wherein the electrically conductive material comprises titanium, aluminum and nitrogen; and wherein the thermal sink comprises the antimony in combination with one or both of titanium and aluminum.

* * * * *